United States Patent [19]
Lee et al.

[11] Patent Number: 5,900,920
[45] Date of Patent: May 4, 1999

[54] APPARATUS FOR AFFIXING A PRINTED CIRCUIT BOARD IN A MONITOR

[75] Inventors: Hyung-sig Lee; Young-tai Kim, both of Suwon, Rep. of Korea

[73] Assignee: Samsung Electronics Co., Ltd., Republic, Rep. of Korea

[21] Appl. No.: 08/912,195

[22] Filed: Aug. 18, 1997

Related U.S. Application Data

[63] Continuation of application No. 08/454,591, May 30, 1995, abandoned.

[30] Foreign Application Priority Data

| May 30, 1994 | [KR] | Rep. of Korea | 94-12091 |
| May 30, 1994 | [KR] | Rep. of Korea | 94-12092 |
| May 30, 1994 | [KR] | Rep. of Korea | 94-12093 |

[51] Int. Cl.$^6$ .................................................. G01R 1/20
[52] U.S. Cl. .......................................... 348/836; 348/839
[58] Field of Search .................................. 348/836, 839, 348/843

[56] References Cited

U.S. PATENT DOCUMENTS

| 3,531,723 | 9/1970 | Watanabe et al. | 348/836 |
| 3,708,618 | 1/1973 | Hofmeister et al. | 348/839 |
| 4,856,101 | 8/1989 | Jonsson et al. | 348/836 |
| 5,023,726 | 6/1991 | Campisi | 348/839 |
| 5,066,906 | 11/1991 | Moore | 324/142 |
| 5,270,639 | 12/1993 | Moore | 324/142 |

*Primary Examiner*—Thomas D. Lee
*Assistant Examiner*—Stephen Brinich
*Attorney, Agent, or Firm*—Banner & Witcoff, Ltd.

[57] ABSTRACT

An apparatus for affixing a printed circuit board within a monitor including a molded frame for supporting the printed circuit board and a fixing structure for releasably engaging the printed circuit board in the frame. The molded frame securely holds the printed circuit board in place and has a central support surface provided by a cross brace to prevent sagging of the printed circuit board in the center. A wire securement structure is also integrally provided on the molded frame for securing the wiring connecting a degaussing coil on the cathode ray tube to an electronic component mounted on the printed circuit board. Securing the wiring facilitates assembly as well as reducing any contact noise that may be generated by a loose wire on board mounted components.

5 Claims, 10 Drawing Sheets

APPARATUS FOR AFFIXING A PRINTED CIRCUIT BOARD IN A MONITOR

This application is a continuation of application Ser. No. 08/454,591, filed May 30, 1995, abandoned.

BACKGROUND OF THE INVENTION

The present invention relates to a structure for affixing a printed circuit board within a monitor case, and more particularly, to a fixing apparatus for stably affixing a printed circuit board (PCB) thereonto. Such a fixing apparatus makes it easier to assemble and disassemble the PCB from the monitor case. The PCB is installed within the monitor case, and the use of a fixing apparatus also prevents the monitor case from sagging due to the combined weight of the electronic components mounted on the PCB and the cathode ray tube, while simultaneously improving the arrangement of the wire connection linked to the components on the PCB and thereby facilitating monitor case assembly.

Generally, the PCB, one of the important components of a monitor, is installed in the monitor case under the cathode ray tube (CRT), and is protected from the exterior. The PCB is firmly attached so as to remain affixed within the monitor case especially when the monitor includes an adjustable stand enabling manipulation of the screen to a proper viewing position.

Further, providing a structure for easily assembling and disassembling a PCB within a monitor case reduces production costs and makes repair more convenient. The numerous electronic components mounted on the PCB may cause the board to sag in its center from the weight of the components.

In addition, in the prior art, the wiring that leads from the degaussing coil which is disposed around the periphery of the CRT to the electronic components mounted on the PCB is left loose within the monitor case. When the front and rear sections of the monitor case were assembled, the wiring is apt to interfere with assembly and often gets caught between the front and rear case sections.

Another consequence of leaving the wiring loose is that contact noise is generated from the wiring and individual electronic components on the PCB and thereby reduce product reliability.

Also in the prior art, the chassis for the PCB is made of metal, the weight of which is borne by the front case section which also bears the weight of the CRT. As monitors are designed with more and more improved features, the number of electronic components mounted on the PCB increases, which in turn adds to the weight of that must be borne by the monitor case. These combined loads often result in deformation of the monitor case over time. Any resultant sagging or failure can allow foreign matter such as dust to infiltrate the inside of the monitor case causing the PCB to malfunction and detracting the appearance of the monitor case.

In prior art structures which utilize screws to affix the PCB to the chassis, the concentrated stress around the screw aperture can extend to the PCB and cause cracks. The engaging force of the screw applied to the periphery of the screw aperture is a stress concentration on the PCB which can spread.

Among the drawbacks of the prior art structures are a decreased yield of production caused by complicated or inconvenient assembly steps, and increased production costs. In addition, the structures are not amenable to easy disassembly for repair which also increases the costs of maintenance.

SUMMARY OF THE INVENTION

Therefore, it is an object of the present invention to provide an apparatus for affixing a PCB in a monitor which will achieve higher productivity and save costs by facilitating assembly and disassembly.

It is another object of the present invention to provide a PCB fixing apparatus which prevents a PCB from sagging and prevents monitor case deformation.

It is still another object of the present invention to provide a PCB fixing apparatus which prevents contact noise by securing the wiring between the degaussing coil and the PCB components which would also eliminate any interference during assembly of the front case section to the rear case section.

To accomplish the above objects of the present invention, there is provided a molded frame into which a PCB is inserted and affixed. The molded frame is provided with a fixing means such as a snap fastener which engages the periphery of the PCB. The molded frame is also provided with a supporting protrusion which extends horizontally generally at the center of the frame to better support the PCB and better distribute the weight of the CRT.

The molded frame also includes securing means for securing the wiring from the degaussing coil to the PCB along the top surface of the molded frame to prevent loose wiring from interfering with assembly and generating contact noise.

Accordingly, the present invention is an apparatus for affixing a PCB within a monitor comprising a frame having protrusions or snap fasteners into which the side portions of the PCB is inserted, a support having a protrusion for preventing sagging due to the weight of the electronic components mounted on the PCB, a dual halting means comprises of supporting tab for preventing sagging of the monitor case due to the weight of the CRT and other electronic components, and a plurality of wire securement tabs for easily securing the wiring connecting the degaussing coil to the electronic components.

These and other features and advantages of the invention may be more completely understood from the following detailed description of the preferred embodiment of the invention with reference to the accompanying drawings.

DETAILED DESCRIPTION OF THE PREFERRED EMBODIMENTS

Figure 1A:
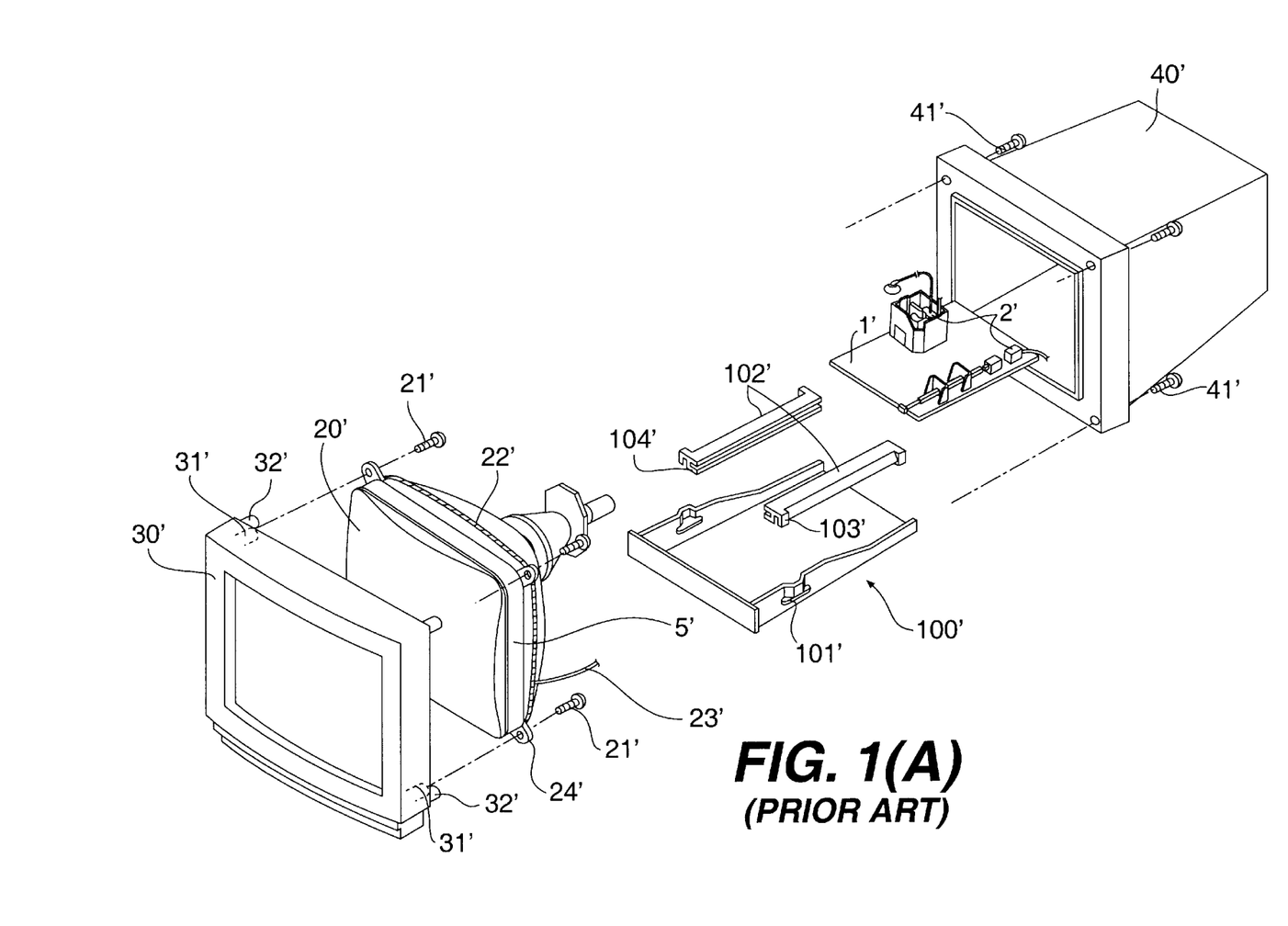
FIG. 1A is an exploded perspective assembly view of a prior art monitor.
Figure 1B:
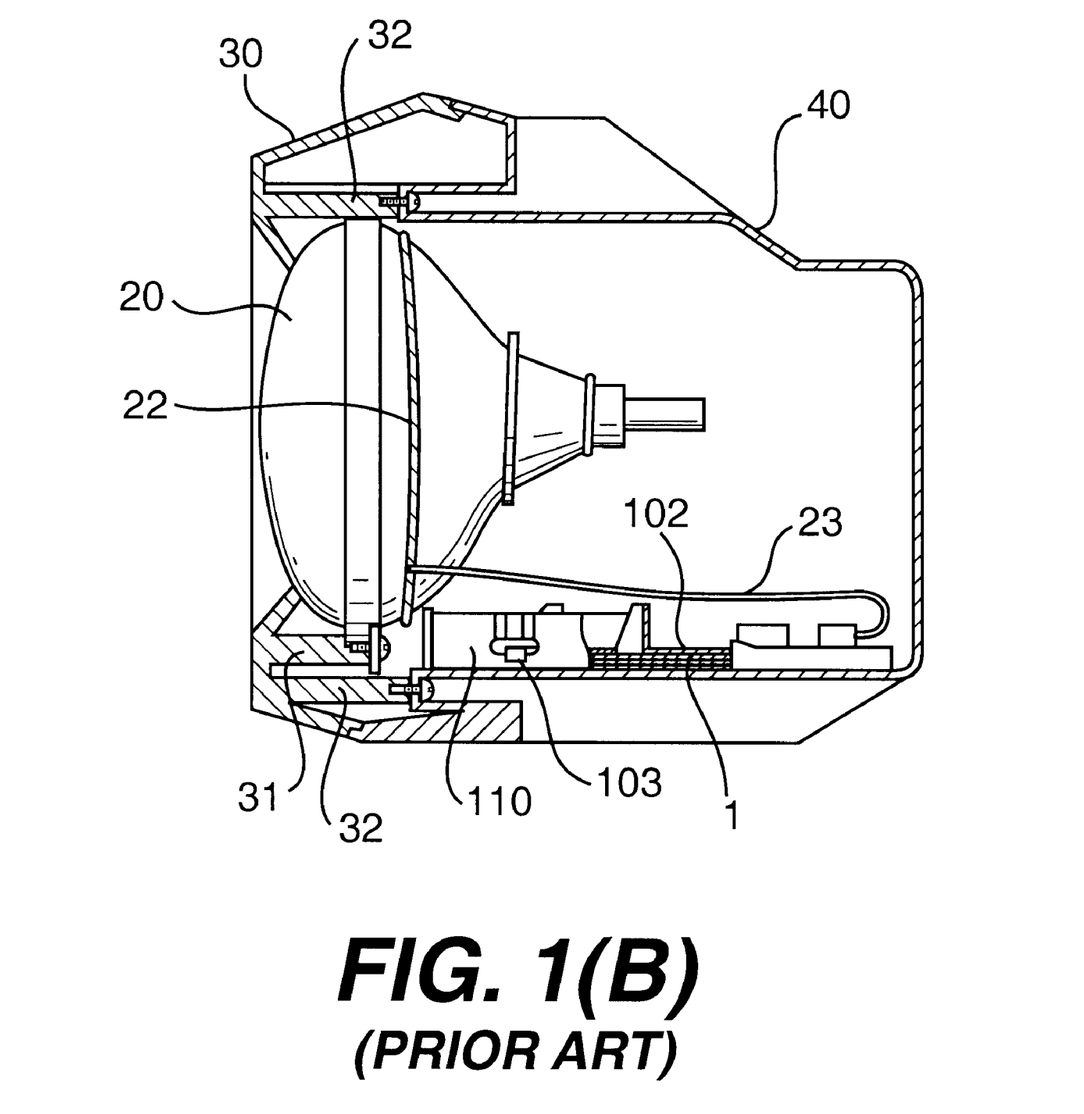
FIG. 1B is a cross-sectional view of the monitor of FIG. 1A shown assembled.

Referring to prior art FIGS. 1A–1B and 2A–2B, in which primed reference numerals are used, FIGS. 1A and 1B show an embodiment of a conventional PCB fixing structure. A monitor case generally comprises a front case section 30' and a rear case section 40' housing a CRT 20' and a PCB 1' which is affixed to a chassis 100'. CRT 20' generally has a degaussing coil 22' which extends around its periphery and has a wire 23' which must be connected to a component on PCB 1'. Front case section 30' includes internally threaded bosses 31' which are positioned to align with coupling apertures of lugs 24' of a band 25' which extends around the periphery of CRT 20'. Screws 21' then connect CRT 20' to front case section 30' via lugs 24' and bosses 31'. As can be seen in FIG. 1A, the CRT and PCB chassis is thus housed inside of the monitor case. Rear case section 40' is attached to the front assembly by screws 41' in threaded bosses 32' located at the corners of front case section 30'.

The PCB and chassis assembly of FIGS. 1A and 1B comprise a chassis 100' which presents a platform for PCB 1'. Chassis 100' has upstanding side walls with detents 101' near the forward edge. A pair of guide rails 102' having engaging hooks 103' at their forward ends and guide grooves 104' are assembled to chassis 100' by engagement of hooks 103' to detents 101'. Thereafter, PCB 1' is slidingly engaged into guide grooves 104'. PCB 1' has a variety of electronic components 2' mounted thereon, one of which receives wire 23'. As seen in FIG. 1B, wire 23' is thus left loose within the assembled monitor 10'.

Figure 2A:
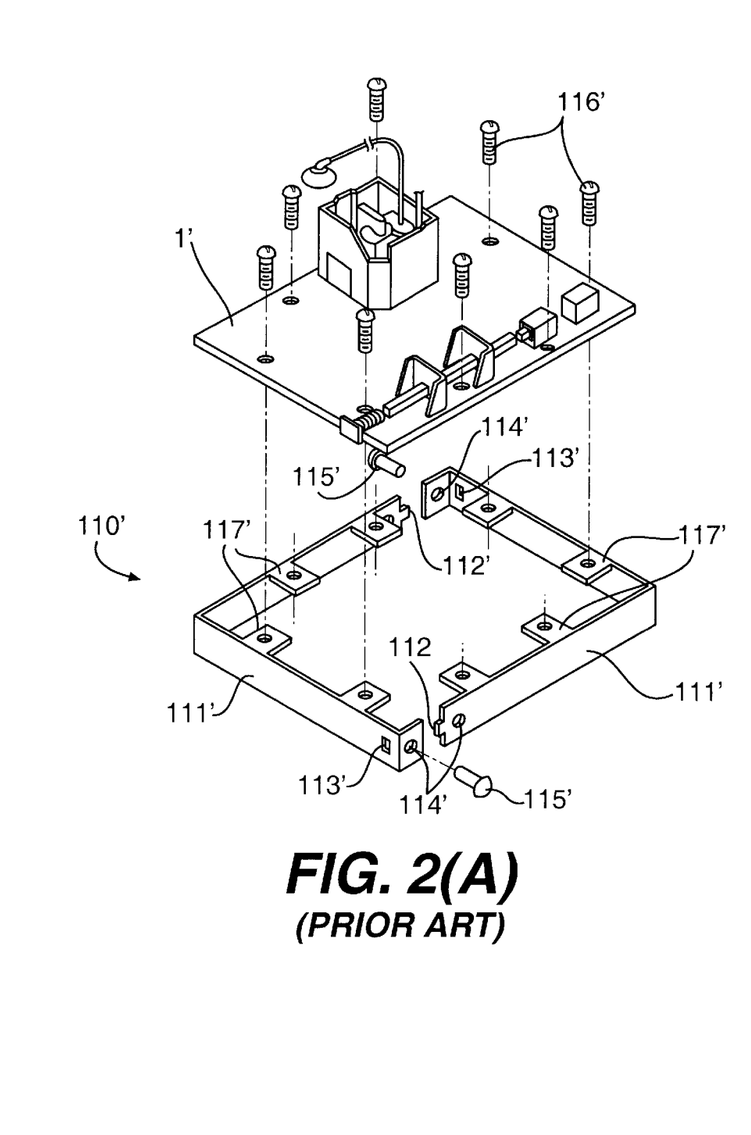
FIG. 2A is an exploded perspective assembly view of another prior art chassis assembly.
Figure 2B:
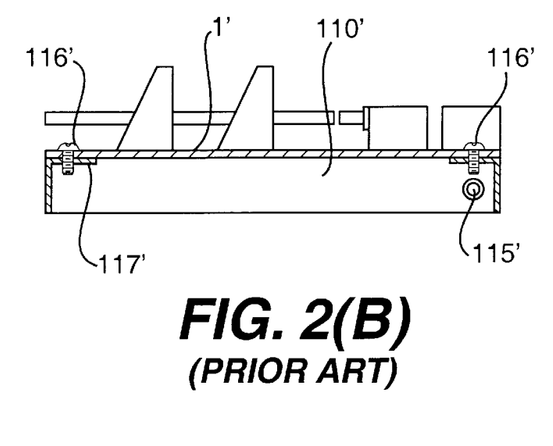
FIG. 2B is a cross-sectional view of the chassis and PCB of FIG. 2A shown assembled.

In prior art FIGS. 2A and 2B, another conventional chassis for a PCB is illustrated. Chassis 110' is made up of two metal L-shaped members 111' which are connected by mating tab 112' and slot 113' combinations, and tightened together by rivets 115' which fasten aligned apertures 114'. The chassis 110' includes a pair board support flanges 117' along each side. Each of the flanges has a coupling aperture, and PCB 1' is provided with apertures corresponding to the locations of the coupling apertures. Screws 116' are used to fasten PCB 1' to flanges 117'.

As discussed in the Background of the Invention section, the prior art apparatus for affixing the PCB within the monitor makes assembly and disassembly inconvenient. Both of the prior art examples discussed above are made of metal which adds to the weight which must be borne by the front case section. A PCB which is screw mounted onto the flanges as in FIGS. 2A and 2B is prone to cracking due to the stress concentrations at the coupling apertures.

Figure 3:
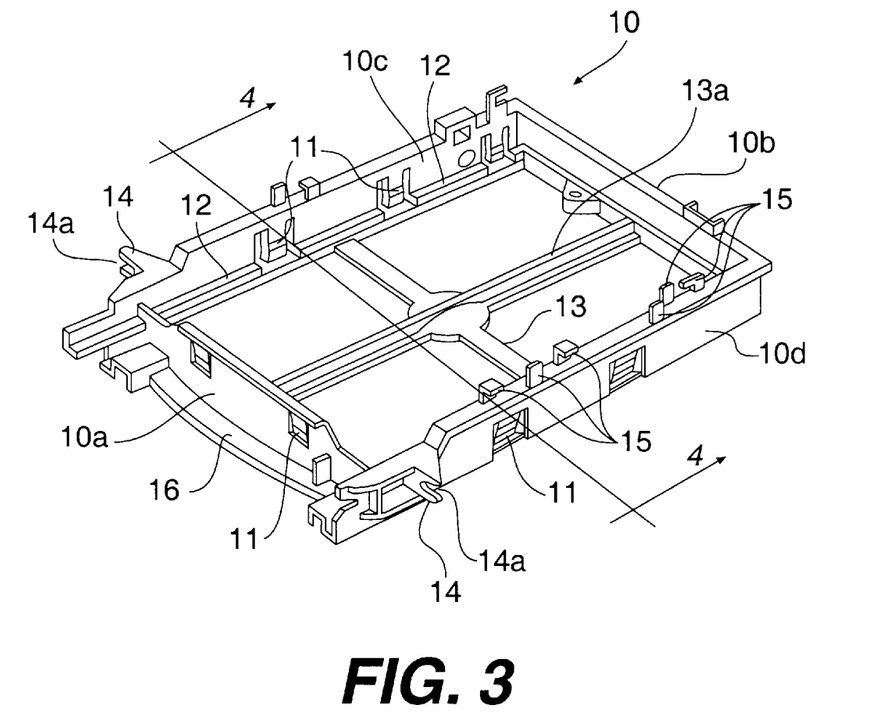
FIG. 3 is a perspective view of a molded frame apparatus for affixing a PCB within a monitor in accordance with a first preferred embodiment of the present invention.

FIG. 3 illustrates a first preferred embodiment of apparatus for affixing a PCB within a monitor. In this embodiment, PCB 1 is affixed to a rectangular molded frame 10 of a plastic material having four walls and a plurality of snap fasteners integrally formed on at least two of its walls. For ease of explanation, the front wall is labeled 10a, the oppposing rear wall is 10b, the left side wall is 10c and the right side wall is 10d. It will be understood that the structural features of any of the walls may be interchanged, and that these designations are for explanation only.

Snap fasteners 11 are integrally formed on at least two walls of frame 10, preferably opposing ones such as 10c and 10d. A supporting lip 12 is integrally formed on each of the walls incorporating the snap fasteners, in this case 10c and 10d, near the bottom of the walls. Supporting lips 12 are spaced a distance below the engaging end of snap fasteners 11, a distance which equals the thickness of PCB 1. Snap fasteners 11 have a beveled guide surface 11a on their interior surfaces which guide PCB 1 down into engagement with supporting lip 12. The resilience of snap fasteners is predetermined to allow sufficient flexure for allowing PCB 1 past guide surface 11a, and locking the PCB on supporting lip 12. A cross brace 13 having a support surface 13a across the bottom of frame 10. Support surface 13a preferably spans the front-to-rear dimension of frame 10, and its horizontal support surface is flush with the support surface of supporting lip 12. Support surface 13a supports PCB 1 to prevent sagging of the PCB due to the weight of electronic components mounted thereon. Also to prevent sagging, a reinforcing member 16 is disposed to the exterior of front wall 10a. In addition, coupling 14 with a coupling slot 14a is integrally provided on each of walls 10c and 10d toward front wall 10a.

Figure 4:
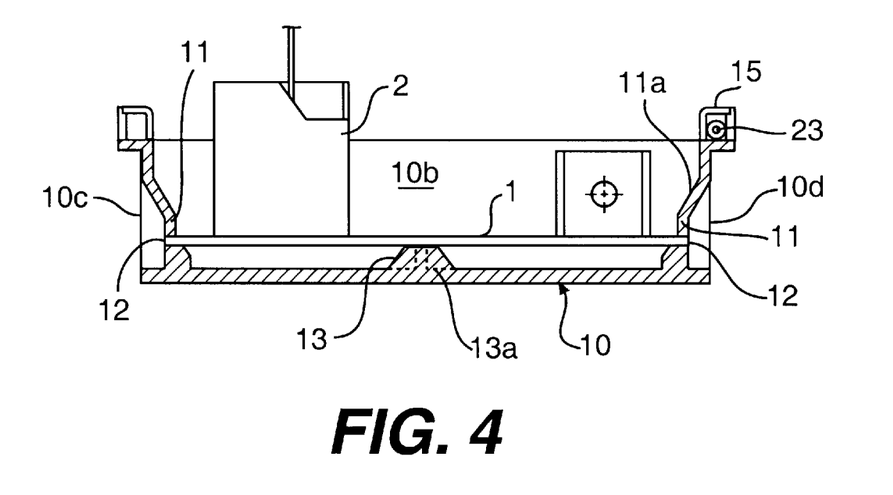
FIG. 4 is a cross-sectional view of the molded frame apparatus of FIG. 3 taken along line 4—4, shown with a PCB assembled thereon.
Figure 5:
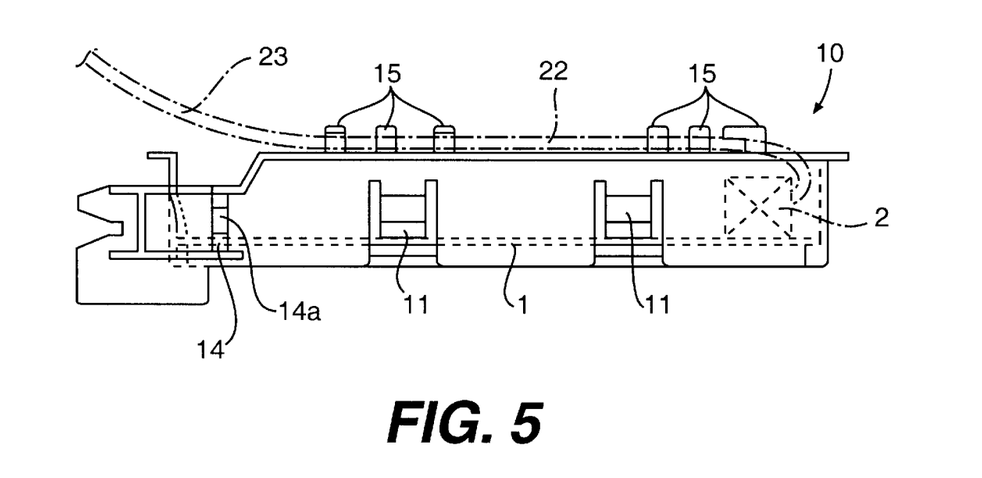
FIG. 5 is a side elevational view of the molded frame of FIG. 3 shown with a PCB assembled thereon.
Figure 6:
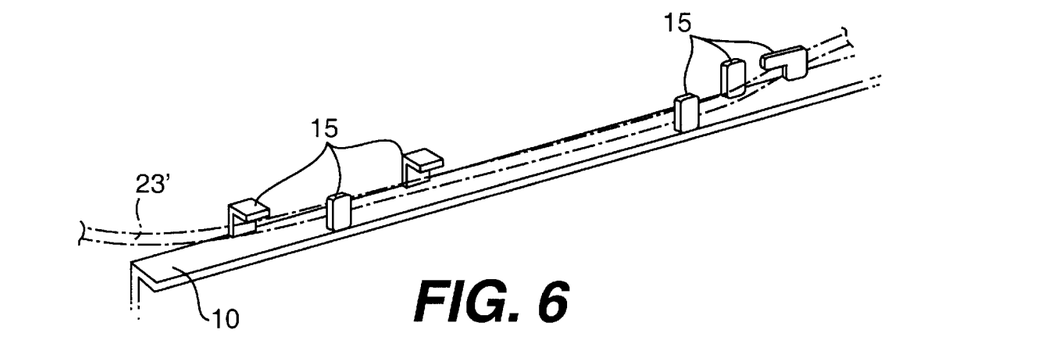
FIG. 6 is a perspective view of the wire securement side of the molded frame of FIG. 3.

A plurality of wire securement tabs 15 are also integrally provided on the upper surface of either of side walls 10c or 10d. Tabs 15 are provided on the top of wall 10d in FIGS. 3 and 4, but could be disposed on other walls. Tabs 15 include straight vertical tabs and those with 90° bends which are cross-faced with one another for easy arrangement of wiring such as wire 23 which extends from degaussing coil 22 to an electronic component 2 mounted on PCB 1. FIGS. 5 and 6 illustrate details of tabs 15 and a preferred arrangement of wire 23 shown in phantom lines. Any number and shape of tabs 15 may be used and various such arrangements are contemplated to within the scope of the present invention.

To assemble, PCB 1 is placed over frame 10 and the edges of the PCB contact beveled guide surfaces 11a of fasteners 11. A slight push downward on the PCB forces fasteners 11 to flex sufficiently to allow the PCB to be engaged between the fasteners and support lip 12 as seen in FIG. 4. The bottom of PCB 1 contacts support surface 13a of brace 13 and is supported thereby to prevent sagging of the PCB and frame 10.

If PCB 1 needs to be replaced or repaired, snap fasteners 11 can be pushed outward to dislodge the PCB and the PCB raised from frame 10. Thus, assembly and disassembly are facilitated and no separate hardware is used in this first preferred embodiment.

Figure 7:
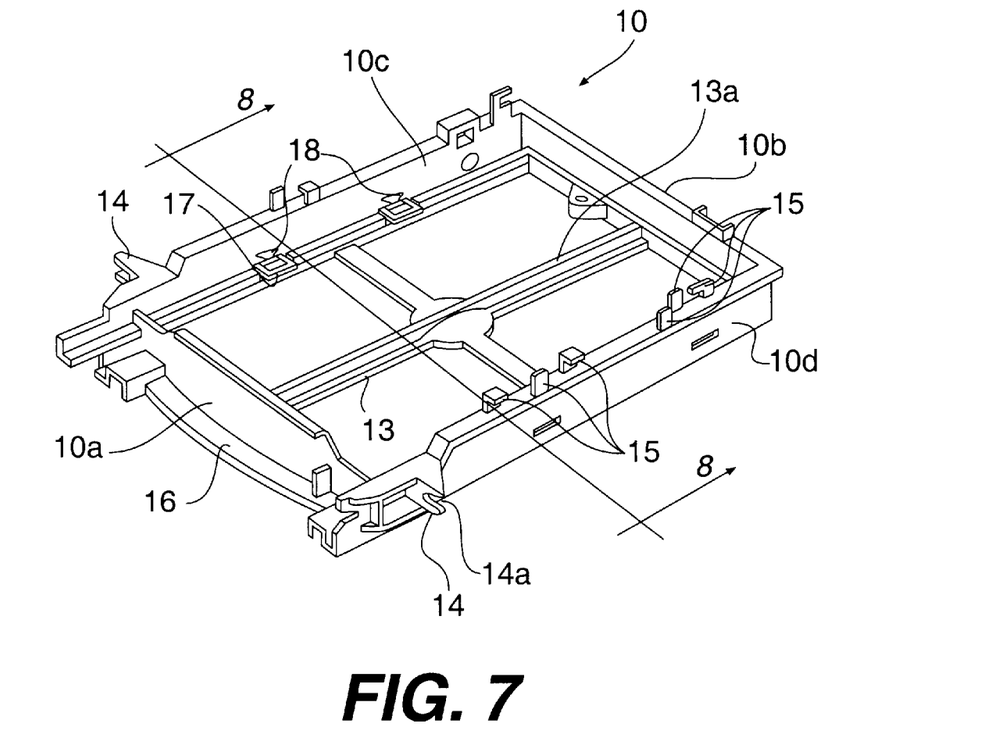
FIG. 7 is a perspective view of a molded frame apparatus in accordance with a second preferred embodiment of the present invention.
Figure 8:
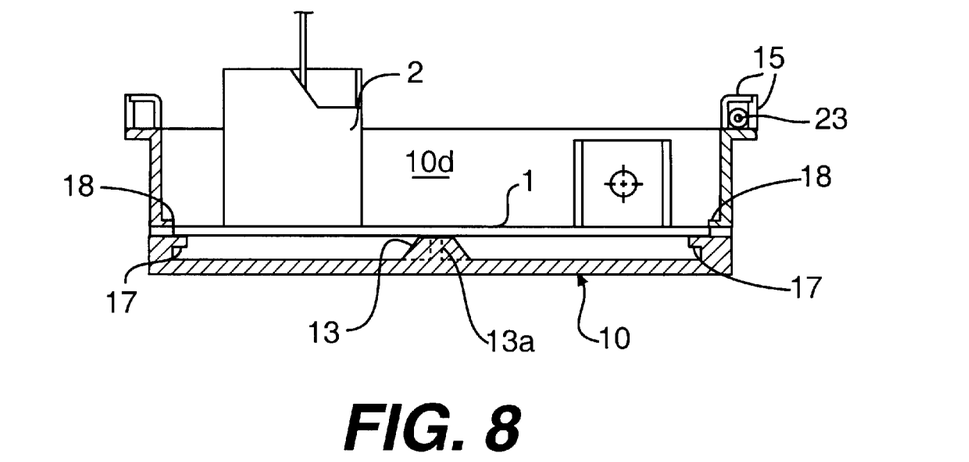
FIG. 8 is a cross-sectional view of the molded frame apparatus of FIG. 7 taken along line 8—8, shown with a PCB assembled thereon.

Referring to FIG. 7, a second preferred embodiment of molded frame 10 is illustrated in which like reference numerals designate like elements. Instead of snap fastener 11, a pair of protrusions, bottom protrusion 17 and top protrusion 18, are used to engage PCB 1. Pairs of these engaging protrusions 17, 18 are preferably provided on at least two walls of frame 10, again preferably opposing ones. At least one bottom protrusion 17 is integrally formed on each of side walls 10c and 10d to support PCB 1, each with a corresponding top protrusion 18. The gap between a pair of protrusions 17 and 18 equals the thickness of PCB 1. FIG. 8 illustrates the assembled frame 10 and PCB 1. To assemble, PCB 1 is tilted so that one side is inserted into protrusions 17 and 18 on one wall, for instance wall 10c is inserted first, then the opposing side, in this instance 10d, can be slightly pressed against the set of protrusions and fitted into place.

Similar to the embodiment of FIG. 3, cross brace 13 with a support surface 13a is provided to support the center of PCB 1 and prevent sagging. The PCB can be disassembled by reversing the assembly steps discussed above, in this manner, assembly and disassembly are facilitated and no additional hardware is necessary.

The embodiments of FIGS. 9–12 illustrate use of snap fasteners to fasten the PCB to the molded frame. However, the paired protrusion embodiment may also be employed.

Figure 9:
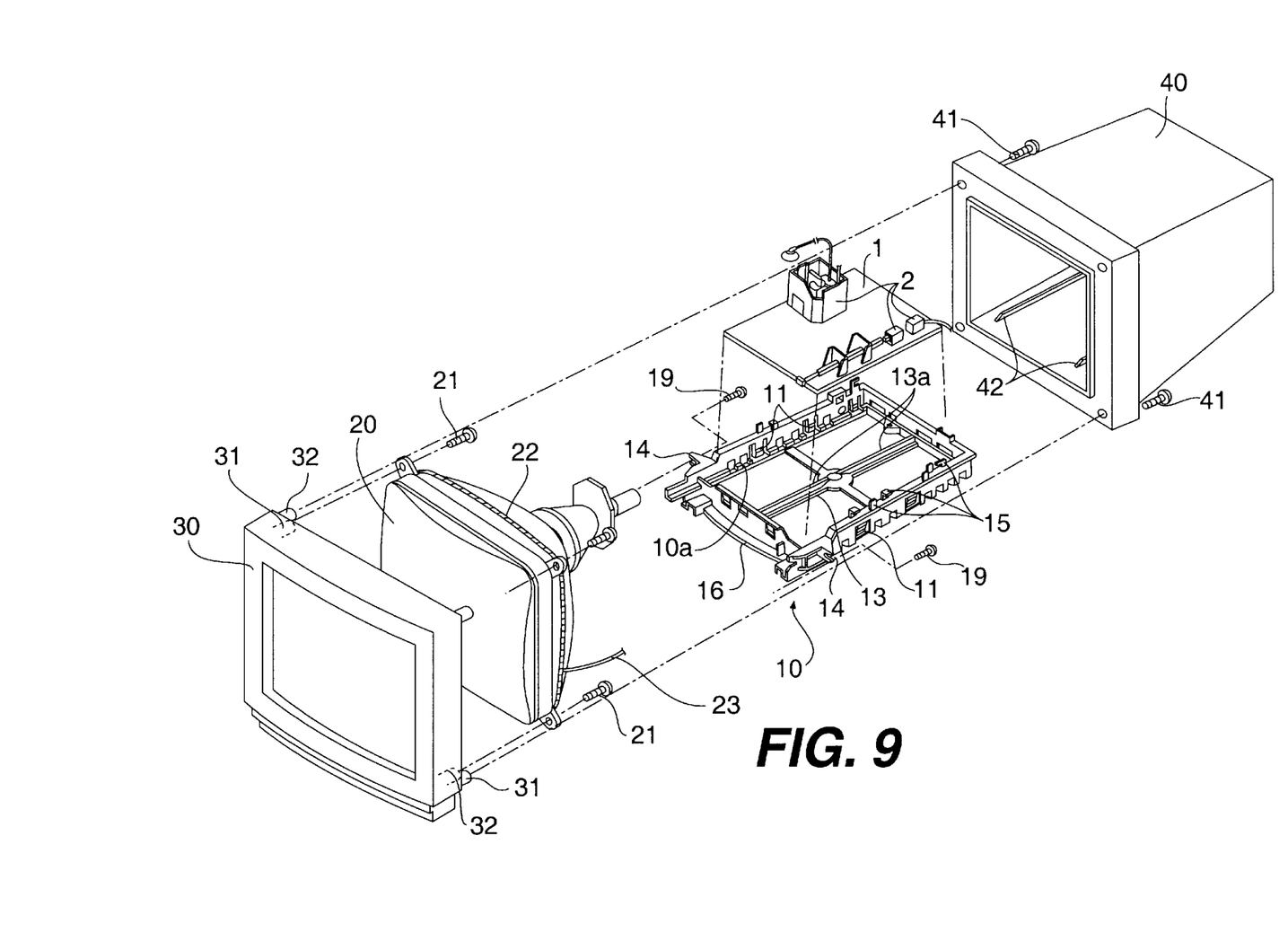
FIG. 9 is an exploded perspective assembly view of a molded frame apparatus and monitor in accordance with a third preferred embodiment of the present invention.
Figure 10:
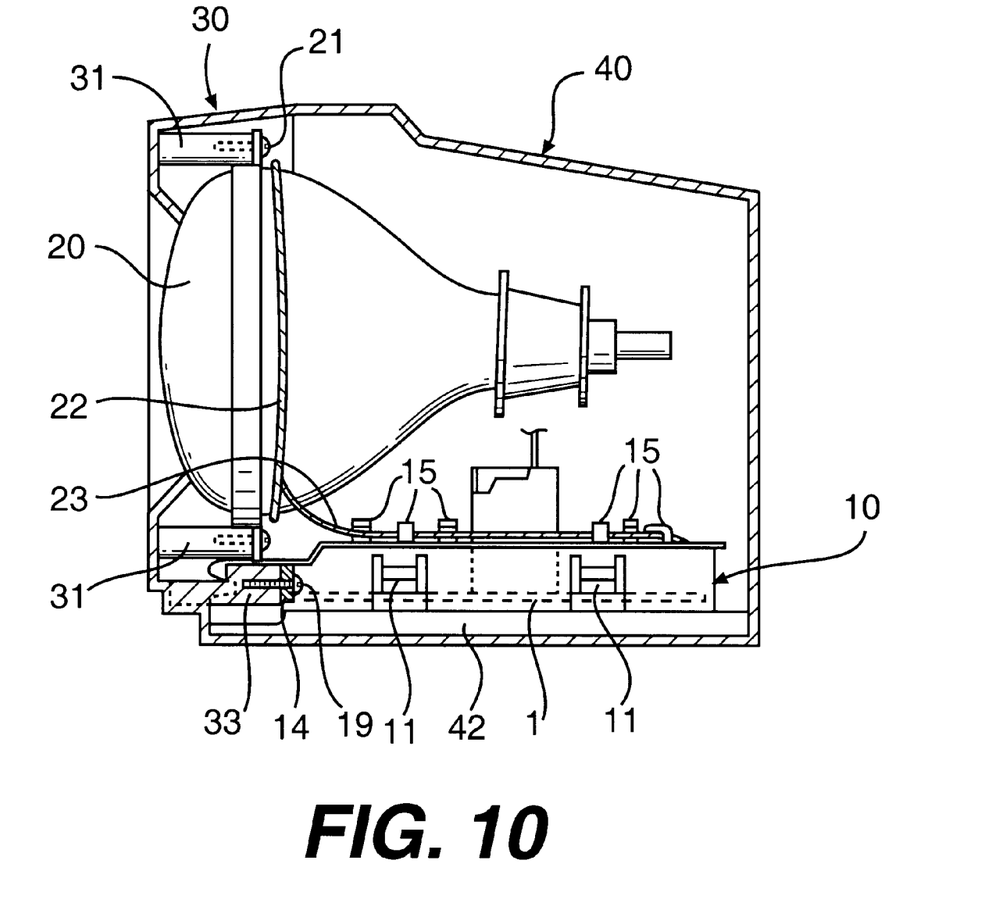
FIG. 10 is an assembled sectional view of the monitor of FIG. 9.

FIGS. 9–10 illustrate a third preferred embodiment of the apparatus of the present invention. FIG. 9 illustrates the entire monitor assembly with molded frame 10 shown in its assembled context. The connection of CRT 20 to front case section 30 and subsequent connection of rear case section 40 to the front case section are similar to that described with reference to the prior art discussion of FIG. 1A. In FIG. 9, the assembly of PCB 1 to molded frame 10 is accomplished with snap fasteners 11 similar to those in the embodiment of FIG. 3. Molded frame 10 is fastened into the monitor case by a pair of screws 19 at the lower portion of front case section 30. Each screw 19 connects a coupling 14 by coupling slot 14a frame fixing portion 33 as shown in FIG. 10.

Once molded frame 10 is thus assembled to CRT 20 and front case section 30, wire 23 having one end connected to degaussing coil 22 of CRT 20 is arranged and inserted to securement tabs 15, as shown in FIGS. 5 and 6, and the opposite end of wire 23 is connected to an electronic component 2 mounted on the PCB. In this manner, wire 23 is secured in place and will not interfere with assembly of the rear case section nor will it generate any of the contact noise that a loose wire would. Rear case section 40 includes ribs 42 on its floor surface for receiving and affixing molded frame 10 therein.

Figure 11:
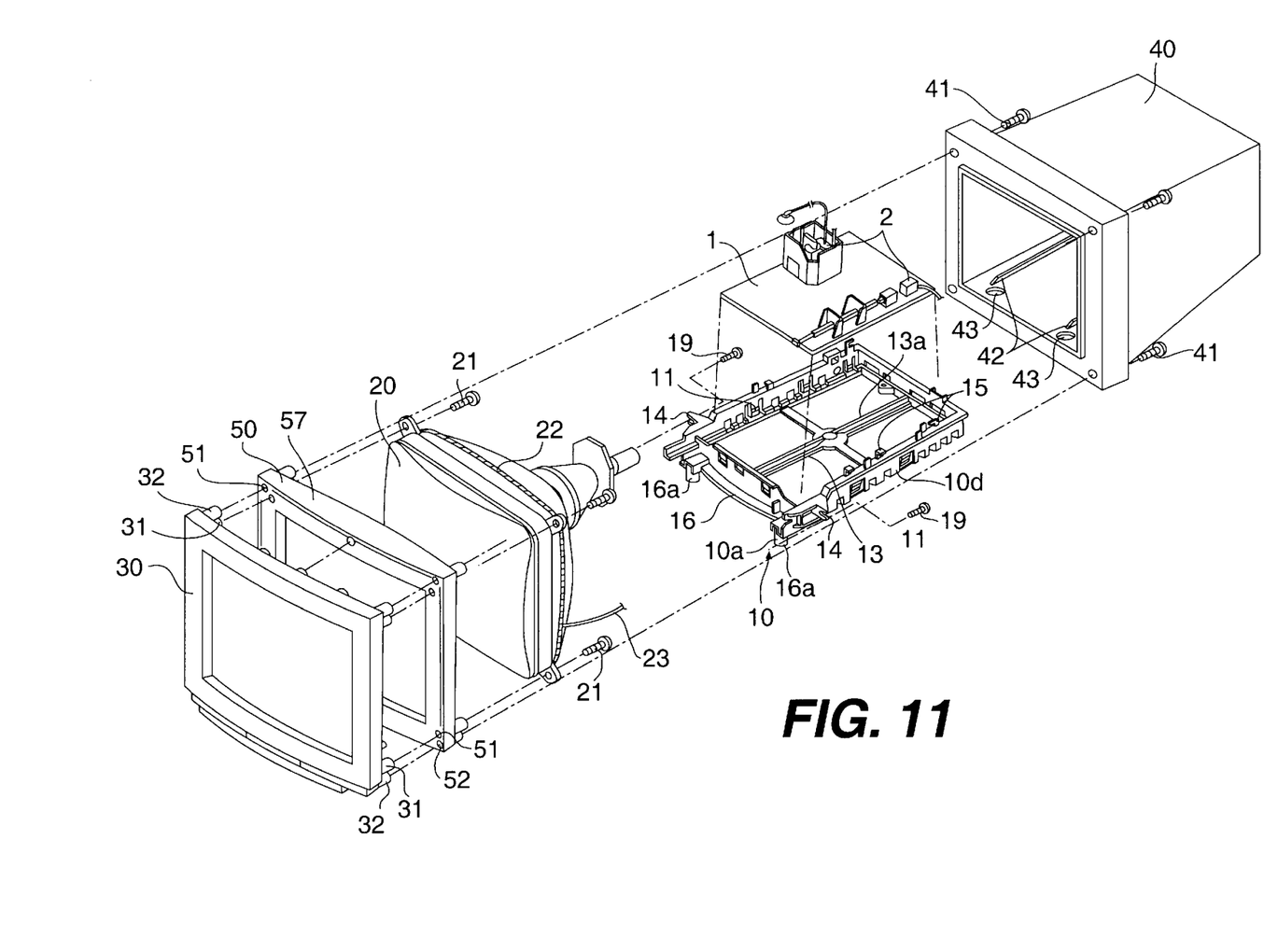
FIG. 11 is an exploded perspective assembly view of a molded frame apparatus and monitor in accordance with a fourth preferred embodiment of the present invention.
Figure 12:
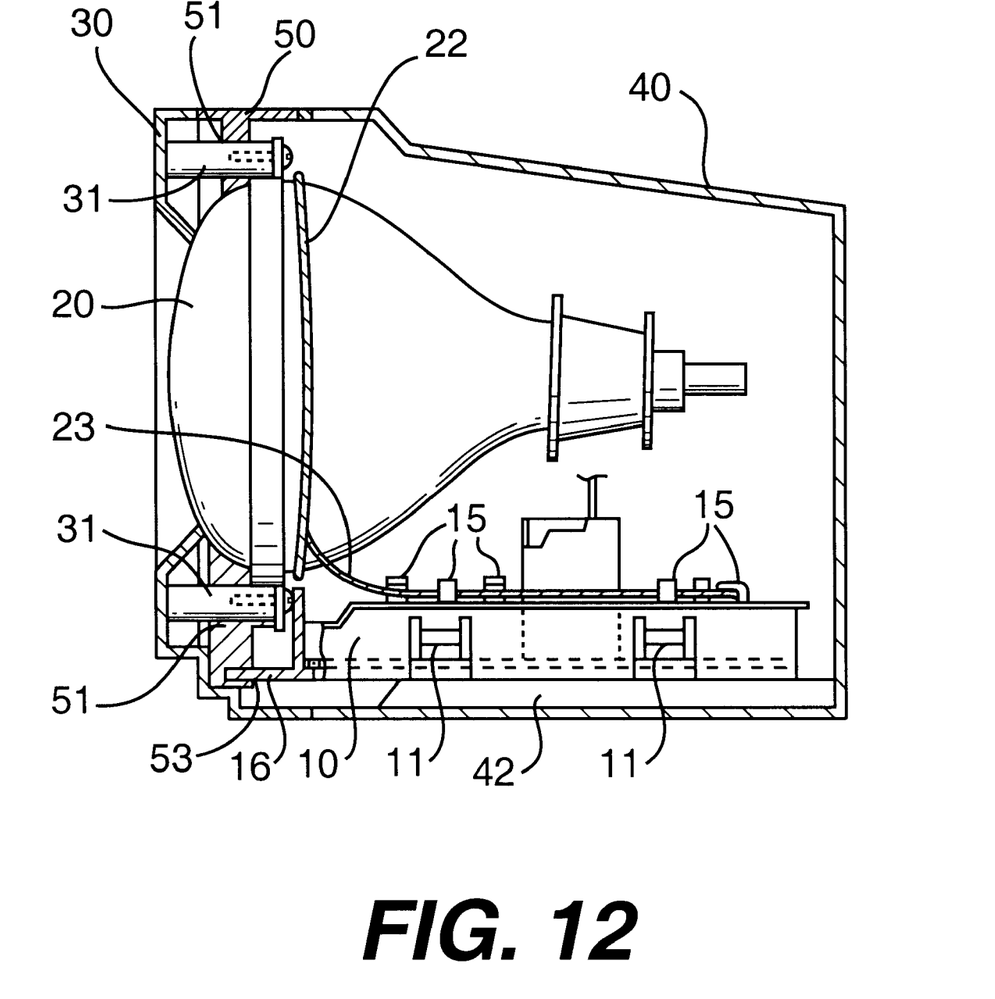
FIG. 12 is an assembled sectional view of the monitor of FIG. 11.

In the fourth preferred embodiment of the invention illustrated in FIGS. 11 and 12, a substantially rectangular intermediate reinforcing frame 50 is interposed between front case section 30 and rear case section 40 in order to prevent sagging and to enhance the visual appearance of the monitor. Intermediate frame 50 strengthens the structural integrity of the monitor by more evenly distributing the load of the CRT and circuit board.

Intermediate frame 50 is configured to be attached to front section 30 and has a fixing hole 51 disposed to engage fixing protrusion 31 of front section 30. Top surface 57 of intermediate frame 50 preferably has overhanging curved edges which generally follow the curve of front section 30. The four corners of intermediate frame 50, are provided with first bosses 51 each having an insertion, and second bosses 52 each having an insertion hole. Bosses 51 and 52 are preferably formed to protrude from the rear surface of intermediate frame 50. First bosses 51 are located so that their insertion holes align with respective first protrusions or elements 31 of front section 30, and second bosses 52 are located so that their insertion holes align with respective second threaded bosses or protrusions 32 of front section 30. First bosses 51 receive first protrusions or elements 31, and second bosses 52 receive second protrusions 32 of front section 30. Screws 21 connect CRT 20 to intermediate frame 50 via bosses 51 and to front case section 30 via lugs 24 and bosses 31. Rear case section 40 is attached to the front assembly by screws 41 in threaded bosses 32 located at the corners of front case section 30 which also pass through bosses 52 of intermediate frame 50.

Molded frame 10 assembled to CRT 20 by screws 19 as described with reference to FIG. 9. Intermediate frame 50 has the necessary frame fixing portions (not shown) which align with coupling slots 14a of couplings 14. In addition reinforcing member 16 is inserted and affixed into a slot 53 in intermediate frame 50 as shown in FIG. 12. Reinforcing member 16 may alternatively be configured to support intermediate frame 50.

As shown in phantom lines in FIG. 11, support columns 16a may be provided on each side of reinforcing member 16. In that instance, rear case section 40 would have correspondingly disposed column apertures 43 on the bottom which can receive columns 16a. Use of columns 16a directs the load of the CRT downward to a table top or other supporting surface. This configuration is directed to prevention of deformation and sagging of the monitor case.

As with the previous embodiments, wire 23 is arranged in tabs 15 along the top of wall 10d so as not to interfere with assembly of the monitor case and to eliminate any contact noise generated by a loose wire.

In this embodiment of the present invention, reinforcing member 16 provided on front wall 10a supports intermediate frame 50 so that the weight of CRT 20 is more evenly distributed and applied to a table or other surface on which the monitor is placed. PCB 1 is thus securely affixed within the monitor case, and assembly and disassembly of the monitor is facilitated to enhance productivity and saving costs.

By securing the wire of the degaussing coil to the molded frame, the assembly of the rear case section is simplified and contact noise generated by a loose wire is eliminated. This allows the monitor to function more consistently and enhances product reliability. In addition, the use of the intermediate frame prevents deformation of the monitor case by more evenly distributing the weight of the elements.

From the foregoing detailed description, it will be evident that there are a number of changes, adaptations, and modifications of the present invention which come within the province of those skilled in the art. However, it is intended that all such variations not departing from the spirit of the invention be considered as within the scope thereof as limited solely by the claims appended hereto.

We claim:

1. An apparatus for affixing a printed circuit board within a monitor case comprising a front case section and a rear case section and housing a cathode ray tube, said apparatus comprising:

an integrally molded frame having four walls for containing said printed circuit board, said frame including laterally deformable releasable fixing means for readily fixing said printed circuit board into fixed engagement with said frame by vertical alignment of said printed circuit board within said four walls and application of downward pressure from above;

said fixing means including a supporting lip on at least two of said four walls of said frame and a snap fastener of predetermined resilience integrally provided on said at least two walls configured to affix said printed circuit board between said lip and said fastener, and said snap fastener including a beveled guide surface to guide lateral flexure of said fastener when said printed circuit board is assembled thereon by application of a vertical pressing force;

wire securement means integral with said molded frame for securing at least one wire as it extends along said printed circuit board, said wire securement means including a plurality of tabs protruding from the top of a wall of said molded frame in a cross-facing position with one another; and a cross brace integrally formed with said molded frame, said brace directly contacting and supporting said printed circuit board affixed thereon to prevent sagging of said printed circuit board.

2. The apparatus of claim 1, further comprising a coupling member on provided on each side of said frame each affixed to the front case section by a fastening screw.

3. The apparatus of claim 1, further comprising a pair of ribs integrally provided in the rear case section to secure said frame therebetween.

4. An apparatus for affixing a printed circuit board within a monitor case having a front case section, a rear case section and an intermediate reinforcing frame interposed therebetween, the monitor case housing a cathode ray tube, said apparatus comprising:

an integrally molded frame having four walls and an integral cross brace with a supporting surface for directly contacting and supporting said printed circuit board;

a coupling formed on said molded frame, said coupling affixing said frame to the intermediate reinforcing frame;

a reinforcing member integrally formed on a front portion of said molded frame and affixed to said intermediate reinforcing frame for preventing sagging and deformation of the monitor case; and said molded frame including releasable fixing means for readily fixing said printed circuit board to said frame, said fixing means including a pair of aligned protrusions on at least two walls of said frame, said pair of protrusions comprising a bottom protrusion for supporting said printed circuit board and a top protrusion for engaging said printed circuit board such that said protrusions define a distance therebetween which is equal to the thickness of said printed circuit board, said fixing means adapted to receive said printed circuit board when said printed circuit board is aligned within said four walls of said frame and placed vertically onto said top protrusions.

5. An apparatus for affixing a printed circuit board within a monitor case comprising a front case section and a rear case section and housing a cathode ray tube, said apparatus comprising:

an integrally molded frame for supporting said printed circuit board to prevent sagging of said printed circuit board, said frame including resiliently deformable releasable fixing means for readily fixing said printed circuit board to said frame by vertical alignment of said printed circuit board within said four walls;

said fixing means including a pair of aligned protrusions on at least two walls of said frame, said pair of protrusions comprising a bottom protrusion for supporting said printed circuit board and a top protrusion for engaging said printed circuit board such that said protrusions define a distance therebetween which is equal to the thickness of said printed circuit board, said top protrusions adapted to deflect laterally upon vertical movement of said printed circuit board into engagement with said bottom protrusions; and wire securement means integral with said molded frame for securing at least one wire as it extends along said printed circuit board, said wire securement means including a plurality of tabs protruding from the top of a wall of said molded frame in a cross-facing position with one another.

* * * * *